(12) United States Patent
Yuen et al.

(10) Patent No.: US 11,088,508 B2
(45) Date of Patent: Aug. 10, 2021

(54) CONTROLLING BEAM DIVERGENCE IN A VERTICAL-CAVITY SURFACE-EMITTING LASER

(71) Applicant: Lumentum Operations LLC, Milpitas, CA (US)

(72) Inventors: Albert Yuen, Milpitas, CA (US); Ajit Vijay Barve, Milpitas, CA (US); Guowei Zhao, Milpitas, CA (US); Eric R. Hegblom, Milpitas, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 15/688,218

(22) Filed: Aug. 28, 2017

(65) Prior Publication Data

US 2019/0067906 A1 Feb. 28, 2019

(51) Int. Cl.
| | |
|---|---|
| H01S 5/183 | (2006.01) |
| H01S 5/062 | (2006.01) |
| G02B 6/42 | (2006.01) |
| H01L 33/10 | (2010.01) |
| H01S 5/42 | (2006.01) |

(Continued)

(52) U.S. Cl.
CPC ........ *H01S 5/06233* (2013.01); *G02B 6/4206* (2013.01); *G02B 30/36* (2020.01); *H01L 33/105* (2013.01); *H01S 5/18311* (2013.01); *H01S 5/18313* (2013.01); *H01S 5/18333* (2013.01); *H01S 5/423* (2013.01); *H01S 5/0282* (2013.01); *H01S 5/18305* (2013.01); *H01S 5/18377* (2013.01); *H01S 2301/16* (2013.01); *H01S 2301/176* (2013.01); *H01S 2301/18* (2013.01)

(58) Field of Classification Search
CPC ............. H01S 5/18311; H01S 5/18313; H01S 2301/18
See application file for complete search history.

(56) References Cited

U.S. PATENT DOCUMENTS

| | | | | |
|---|---|---|---|---|
| 5,822,356 A | | 10/1998 | Jewell | |
| 5,881,085 A | * | 3/1999 | Jewell | ..................... G02B 3/00 257/79 |

(Continued)

OTHER PUBLICATIONS

Hegblom et al. ("Scattering losses from dielectric apertures in vertical cavity lasers", IEEE J. of selected topics in quantum electronics, vol. 3, No. 2 Apr. 1997) (Year: 1997).*

(Continued)

*Primary Examiner* — Tod T Van Roy
(74) *Attorney, Agent, or Firm* — Harrity & Harrity, LLP (57) ABSTRACT

In some implementations, a vertical cavity surface emitting laser (VCSEL) includes a substrate layer and epitaxial layers on the substrate layer. The epitaxial layers may include an active layer, a first mirror, a second mirror, and one or more oxidation layers. The active layer may be between the first mirror and the second mirror, and the one or more oxidation layers may be proximate to the active layer. The one or more oxidation layers may be configured to control beam divergence of a laser beam emitted by the VCSEL based on at least one of: a quantity of the one or more oxidation layers, a shape of the one or more oxidation layers, a thickness of the one or more oxidation layers, or a proximity of the one or more oxidation layers to the active layer.

20 Claims, 7 Drawing Sheets

(51) Int. Cl.
*G02B 30/36* (2020.01)
*H01S 5/028* (2006.01)

(56) References Cited

U.S. PATENT DOCUMENTS

| | | | | |
|---|---|---|---|---|
| 6,803,604 B2* | 10/2004 | Takahashi | ............... | B82Y 20/00 257/80 |
| 2001/0006528 A1* | 7/2001 | Sato | ................... | H01S 5/18305 372/46.013 |
| 2002/0071471 A1* | 6/2002 | Kim | ................. | H01L 31/03046 372/96 |
| 2003/0174750 A1* | 9/2003 | Otsubo | ................. | B82Y 20/00 372/45.01 |
| 2008/0187015 A1* | 8/2008 | Yoshikawa | ............ | B82Y 20/00 372/45.01 |
| 2009/0262765 A1 | 10/2009 | Chang et al. | | |
| 2012/0071471 A1* | 3/2012 | Nardi | ................... | C07D 265/18 514/230.5 |
| 2012/0251039 A1* | 10/2012 | Shimizu | .............. | H01S 5/18311 385/14 |
| 2015/0155433 A1* | 6/2015 | Lo | ........................... | H01L 33/10 257/94 |
| 2016/0064900 A1* | 3/2016 | Takeda | ................ | H01S 5/18311 438/29 |

OTHER PUBLICATIONS

Naone et al., "Oxidation of AlGaAs layers for tapered apertures in vertical-cavity lasers", Electronic Letters, Feb. 13, 1997, vol. 33, No. 4, 2 pages.

Hegblom et al., "High Performance Small Vertical-Cavity Lasers: A Comparison of Measured Improvements in Optical and Current Confinement in Devices Using Tapered Apertures", IEE Journal of Selected Topics in Quantum Electronics, vol. 5, No. 3, May/Jun. 1999. 8 pages.

Extended European Search Report for Application No. EP18189172.2, dated Jan. 23, 2019, 8 pages.

* cited by examiner

FIG. 4

CONTROLLING BEAM DIVERGENCE IN A VERTICAL-CAVITY SURFACE-EMITTING LASER

TECHNICAL FIELD

The present disclosure relates generally to lasers and, more particularly, to controlling beam divergence in a vertical-cavity surface-emitting laser (VCSEL).

BACKGROUND

A vertical-emitting device, such as a vertical-cavity surface-emitting laser (VCSEL), is a laser in which a laser beam is emitted in a direction perpendicular to a surface of a substrate (e.g., vertically from a surface of a semiconductor wafer). Contrary to edge-emitting devices, vertical-emitting devices may allow for testing to occur at intermediate steps of wafer fabrication.

SUMMARY

According to some possible implementations, a VCSEL may include a substrate layer and epitaxial layers on the substrate layer. The epitaxial layers may include an active layer, a first mirror, a second mirror, and one or more oxidation layers. The active layer may be between the first mirror and the second mirror, and the one or more oxidation layers may be proximate to the active layer. The one or more oxidation layers may be configured to control beam divergence of a laser beam emitted by the VCSEL based on at least one of: a quantity of the one or more oxidation layers, a shape of the one or more oxidation layers, a thickness of the one or more oxidation layers, or a proximity of the one or more oxidation layers to the active layer.

According to some possible implementations, a method of controlling beam divergence in a VCSEL may include forming, on a substrate layer of the VCSEL, an active layer, a first mirror, and a second mirror. The active layer may be formed between the first mirror and the second mirror. The method may include forming one or more oxidation layers proximate to the active layer. The one or more oxidation layers may be configured to control beam divergence of a laser beam emitted by the VCSEL based on at least one of: a quantity of the one or more oxidation layers, one or more shapes of the one or more oxidation layers, one or more thicknesses of the one or more oxidation layers, or one or more proximities of the one or more oxidation layers to the active layer.

According to some possible implementations, a VCSEL wafer may include a substrate layer and epitaxial layers on the substrate layer. The epitaxial layers may include an active layer between a first mirror and a second mirror, and one or more oxidation layers, proximate to the active layer, configured to control beam divergence of an emitted laser beam by controlling an effective refractive index step proximate to an active region of the active layer based on at least one of: a quantity of oxidation layers included in the one or more oxidation layers, a shape of at least one oxidation layer of the one or more oxidation layers, a thickness of at least one oxidation layer of the one or more oxidation layers, or a proximity of at least one oxidation layer, of the one or more oxidation layers, to the active region of the active layer.

DETAILED DESCRIPTION

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations.

Figure 1A:
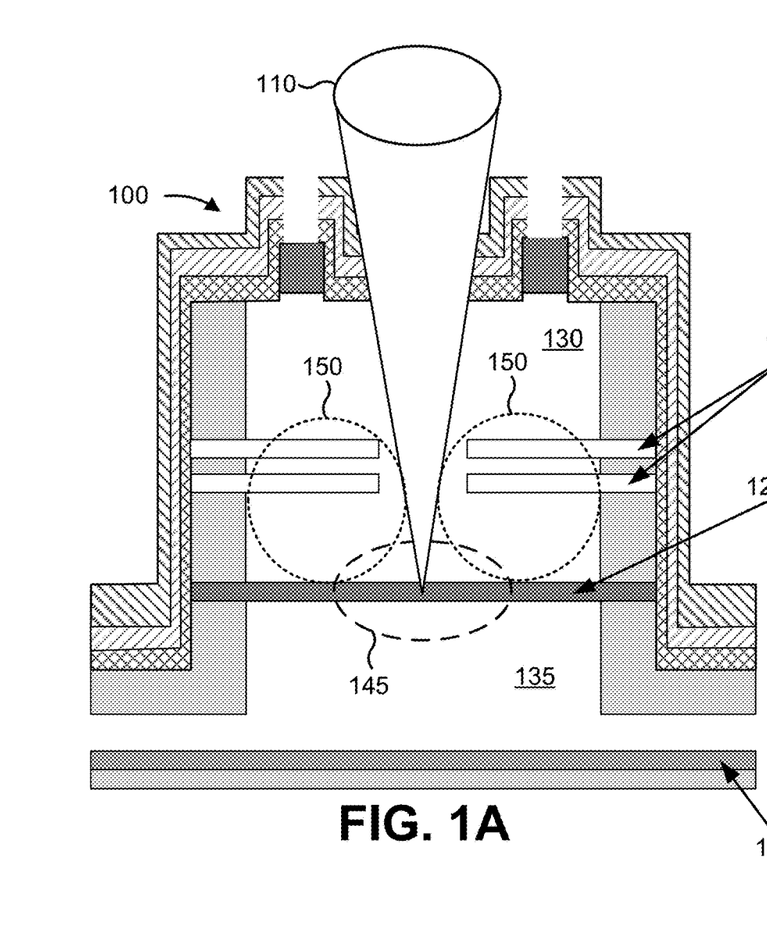
FIGS. 1A and 1B are diagrams of different emitters with different beam divergences.
Figure 1B:
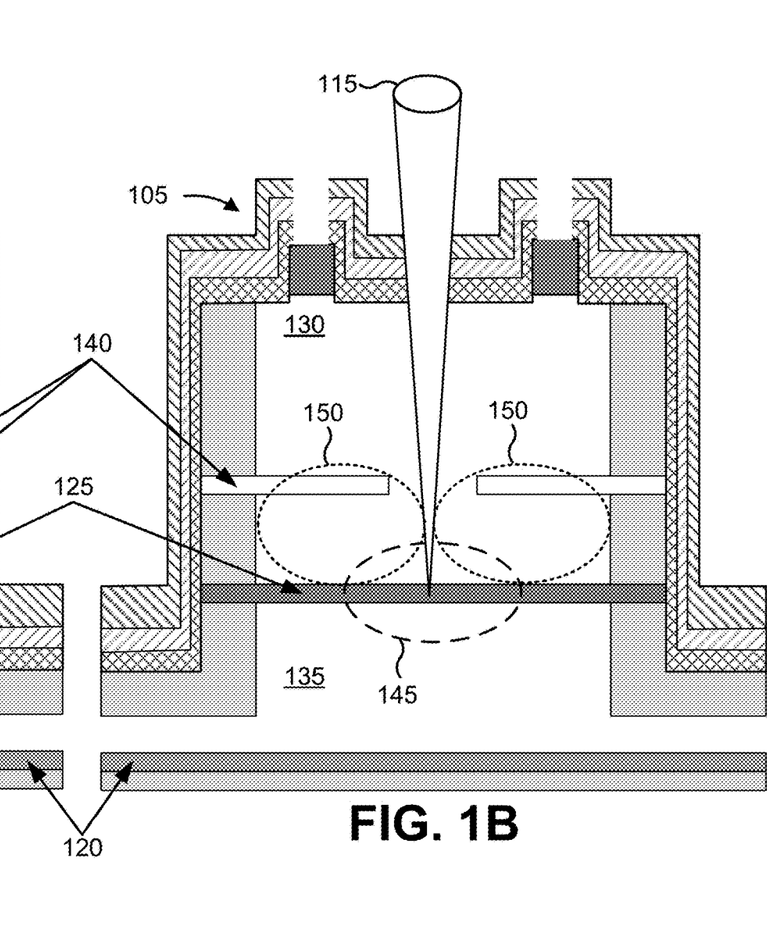

FIGS. 1A and 1B are diagrams of different emitters (e.g., VCSELs) 100, 105 with different beam divergences. A first emitter 100 may emit a laser beam 110 with a wider beam divergence, a higher numerical aperture, and a wider spectral width. A second emitter 105 may emit a laser beam 115 with a narrower beam divergence, a lower numerical aperture, and a narrower spectral width.

Emitters, such as VCSELs, may be used for a variety of applications requiring different optical mode characteristics, such as beam divergence, numerical aperture, and/or spectral width. For example, in consumer applications, such as three-dimensional sensing, an emitter with a higher numerical aperture, wider beam divergence, and wider spectral width (e.g., emitter 100) may be desirable to improve safety by reducing the amount of light that may enter the human eye. As another example, in data communications, an emitter with a lower numerical aperture, narrower beam divergence, and narrower spectral width (e.g., emitter 105) may be desirable to increase fiber coupling efficiency and/or increase the transmission distance. Some techniques described herein permit the flexible design of emitters 100, 105 for a variety of applications that require different beam divergences, numerical apertures, and/or spectral widths.

As shown in FIGS. 1A and 1B, emitters 100, 105 may include a substrate layer 120 and epitaxial layers formed on the substrate layer 120. The epitaxial layers may include an active layer 125, a first mirror 130, a second mirror 135, and one or more oxidation layers 140. The active layer 125 may be between the first mirror 130 (e.g., a top mirror) and the second mirror 135 (e.g., a bottom mirror). Additional details regarding example emitters 100, 105 are described elsewhere herein.

The beam divergence, numerical aperture, and spectral width of a laser beam emitted by an emitter 100, 105 are controlled by the optical mode of light emitted by the emitter 100, 105. The optical mode is controlled by an effective refractive index step between an active region 145, of the active layer 125, and an oxidation area 150 associated with the one or more oxidation layers 140. The effective refractive index step may represent a relative difference between an effective refractive index of the oxidation area 150 relative to an effective refractive index of the active region 145. Some techniques described herein modify an effective refractive index of the oxidation area 150, which modifies an optical mode of the emitter 100, 105, which modifies the beam divergence, numerical aperture, and spectral width of a laser beam emitted by the emitter 100, 105. For example, increasing the effective refractive index of the oxidation area 150 results in a larger effective refractive index step proximate to the active region 145, which increases optical confinement and produces a laser beam with a wider divergence, a higher numerical aperture, and a wider spectral width, as shown by emitter 100 and laser beam 110. Conversely, decreasing the effective refractive index of the oxidation area 150 results in a smaller effective refractive index step proximate to the active region 145, which reduces optical confinement and produces a laser beam with a narrower divergence, a lower numerical aperture, and a narrower spectral width, as shown by emitter 105 and laser beam 115.

Techniques described herein relate to modifying characteristics of oxidation layer(s) 140 to modify an effective refractive index of the oxidation area 150 and control optical mode characteristics of an emitter, such as a VCSEL. For example, emitter 100 includes a greater number of oxidation layers 140 (e.g., two oxidation layers 140), which increases the effective refractive index of the oxidation area 150, resulting in a wider beam divergence of laser beam 110. As another example, emitter 105 includes a lesser number of oxidation layers 140 (e.g., one oxidation layer 140), which decreases the effective refractive index of the oxidation area 150, resulting in a narrower beam divergence of laser beam 115. The quantity of oxidation layers 140 is one example of an oxidation layer characteristic that can be modified to modify the effective refractive index of the oxidation area 150. Other characteristics include the shape, thickness, and/or proximity of the oxidation layer(s) 140 to the active layer 125, and will be described in more detail elsewhere herein. By modifying characteristics of oxidation layer(s) 140, emitters can be designed for a variety of applications with varying requirements.

In some implementations, the design of oxide layers 140 and resulting oxide apertures account for an overall lateral index profile created by thermal lensing associated with an oxide aperture, particularly when an effective refractive index step is small. For example, the VCSEL may be hotter closer to the center of the oxide aperture, and the temperature drop toward the edge of the oxide aperture creates a corresponding drop in the semiconductor refractive index from the center of the oxide aperture to the edge of the oxide aperture. Techniques described herein that modify the effective refractive index step do not affect this thermal lensing effect in the first order.

In some cases, multiple oxide layers 140 have been used to reduce parasitic capacitances that limit high-speed modulation (e.g., 20 GHz and/or the like) of VCSELs in data communication applications. Some techniques described herein apply to high optical power VCSELs with limited modulation (e.g., 10 MHz and/or the like), where multiple oxide layers 140 have not been used to reduce parasitic capacitances.

Furthermore, the design of a VCSEL requires not just control of the divergence of the laser beam, but also the uniformity of the angular distribution of light intensity (e.g., the far-field), particularly for the case of satisfying laser safety standards. In these standards, output power delivered through an aperture (e.g., of typically 7 mm diameter) placed typically 100 mm away from the source must be below a particular value depending upon wavelength and pulsing conditions. Furthermore, all the possible angular placements of the aperture relative to the source must be considered. Thus, for applications in which the far-field of the VCSEL or VCSEL array can be viewed by the human eye (e.g., either directly or through lenses), the far-field must not only have a minimum divergence, but also cannot have spikes or angular cones in which the light intensity is concentrated.

The divergence of individual lasing modes increases for smaller aperture sizes. However, high divergence cannot simply be achieved by making a smaller aperture diameter (e.g. <5 um) due to the inability to control the aperture size (or equivalently the oxidation length or depth) in manufacturing, as well as other engineering constraints such as the number of emitters in an array. Therefore, high divergence needs to be achieved with a larger individual VCSEL diameter (e.g., with a 7 um to approximately 15 um diameter aperture). To achieve this requires the laser to lase partially in higher order modes that have higher divergence, and that have multiple lobes in the far-field. To avoid concentrations of light near particular angles requires a mixture of both higher order and lower order modes to lase simultaneously. Multi-mode VCSELs used for data communication lase in a mixture of higher and lower order modes, but typically do not have wide enough divergence to meet requirements for free-space sensing applications because these VCSELs are typically engineered to have fewer modes to achieve a narrower spectral width as required by typical multi-mode fiber data communication standards.

To enable increased lasing of higher order modes, as compared to VCSELs used for data communication, requires a larger lateral effective index step, which may be achieved with multiple oxide apertures, a thicker oxide aperture, and/or other techniques described herein. The effective index is defined by the integral (along the vertical axis) of the refractive index weighted by the electrical field intensity. The effective index step may be calculated by the difference between the effective index along the vertical axis in the center of the device (without oxide) less the effective index along the vertical axis through the thickest portion of the oxide layers (near the edge of the device). Additionally, or alternatively, the effective index step may be calculated by comparing the resonant wavelength for plane waves travelling along the vertical axis in the center of the device to the plane waves traveling along the vertical axis at the edge of the device and encountering the thickest portion of the oxide layers.

One way to produce a large change in the effective index step is with an abrupt jump or step. However, a large abrupt step in lateral effective index has two problems. First, it requires blunt oxidation fronts, which are prone to increase the mechanical stress in the device. Second, it requires an abrupt step in effective refractive index, which increases scattering loss for the higher order modes, thereby inhibiting lasing in those modes. Therefore, the larger later index step must be achieved with some tapering of the lateral index profile.

Too long a taper or equivalently too low a lateral index gradient, however, can lead to two problems. In the extreme case, too long a taper will effectively appear like a small index step near the active region, and the higher order modes will be too wide spatially to overlap with the active region of the device (where the current flows into the quantum wells) and will not lase or will lase very little. But in the intermediate case, too long a taper (or equivalently too low a lateral index gradient), can reduce the scattering loss too much for the higher order modes such that they have almost the same loss as the lowest order modes. Such low loss can be a problem at low temperatures (e.g., −40 C to 5 C). Typically, in VCSELs operating at a low temperature, the peak of the gain spectrum of the active region will be shorter in wavelength than the lasing modes. At higher temperatures, both the peak of the gain spectrum and the lasing mode shift to longer wavelengths, but the peak of the gain spectrum shifts faster and better aligns with all the lasing modes. The higher order modes, however, lase at shorter wavelength than the lower order or the lowest order (e.g., fundamental) mode. Therefore, the threshold carrier density (and hence threshold current) will be lower for the higher order modes at low temperature when the scattering loss is low. Potentially, this difference can lead to lasing primarily on a single or a few higher order modes and lead to concentration of light in a particular angular cones, which is undesirable when trying to achieve a more uniform angular distribution of light intensity as is commonly required for sensing applications.

Consequently, for a given size and wavelength of VCSEL, there is both an upper and lower bound to the lateral index gradient and effective refractive index step in order to achieve sufficient divergence and a sufficiently uniform far-field profile. Although it is possible to determine the shape of the lateral modes of a waveguide with various finite element software, it is difficult to predict the relative optical power of the lasing modes in a VCSEL because the resulting combination of modes will depend upon the current injection profile, the temperature profile, the optical gain versus carrier density and carrier diffusion. In some cases, the aperture can be designed as follows: For lasers in the 900 to 960 nm wavelength range with an effective aperture diameter between 6 and 10 micrometer, the effective refractive index step required is at least 0.060 with an average effective index gradient between 0.027 $um^{-1}$ and 0.108 $um^{-1}$, or equivalently a taper length between 0.5 and 2 micrometers to achieve a divergence of at least 0.20 NA at injection current density of 7 $kA/cm^2$, where NA is the numerical aperture defined as the sine of the half-angle of a cone that encircles 86% of the optical power and such that the far-field is sufficiently uniform when the VCSEL is driven under continuous wave (CW) or quasi-CW conditions. To be sufficiently uniform requires that the optical power passing through a cone light with a half angle of 2 degrees (for any orientation with respect to the primary direction of the laser beam) is no more than 3% a fraction of the total optical output power. The oxide aperture need not be exactly circular, so effective aperture diameter mentioned above is the diameter of a circle of equivalent area.

In the case of narrow divergence, for lasers in the 900 to 960 nm wavelength range with an effective aperture diameter between 9 and 11 micrometers, the effective refractive index step (in absence of thermal gradients) required is at most 0.0019 to achieve a divergence of at most 0.20 NA at injection current density of at least approximately 14 $kA/cm^2$. Additionally, the aperture must be placed at most approximately 0.19 micrometers vertically from the active region in order ensure optical gain primarily excites the lowest order modes. Techniques described herein are capable of meeting the requirements described above.

As indicated above, FIGS. 1A and 1B are provided as examples. Other examples are possible and may differ from what was described in connection with FIGS. 1A and 1B.

Figures 2A, 2B:
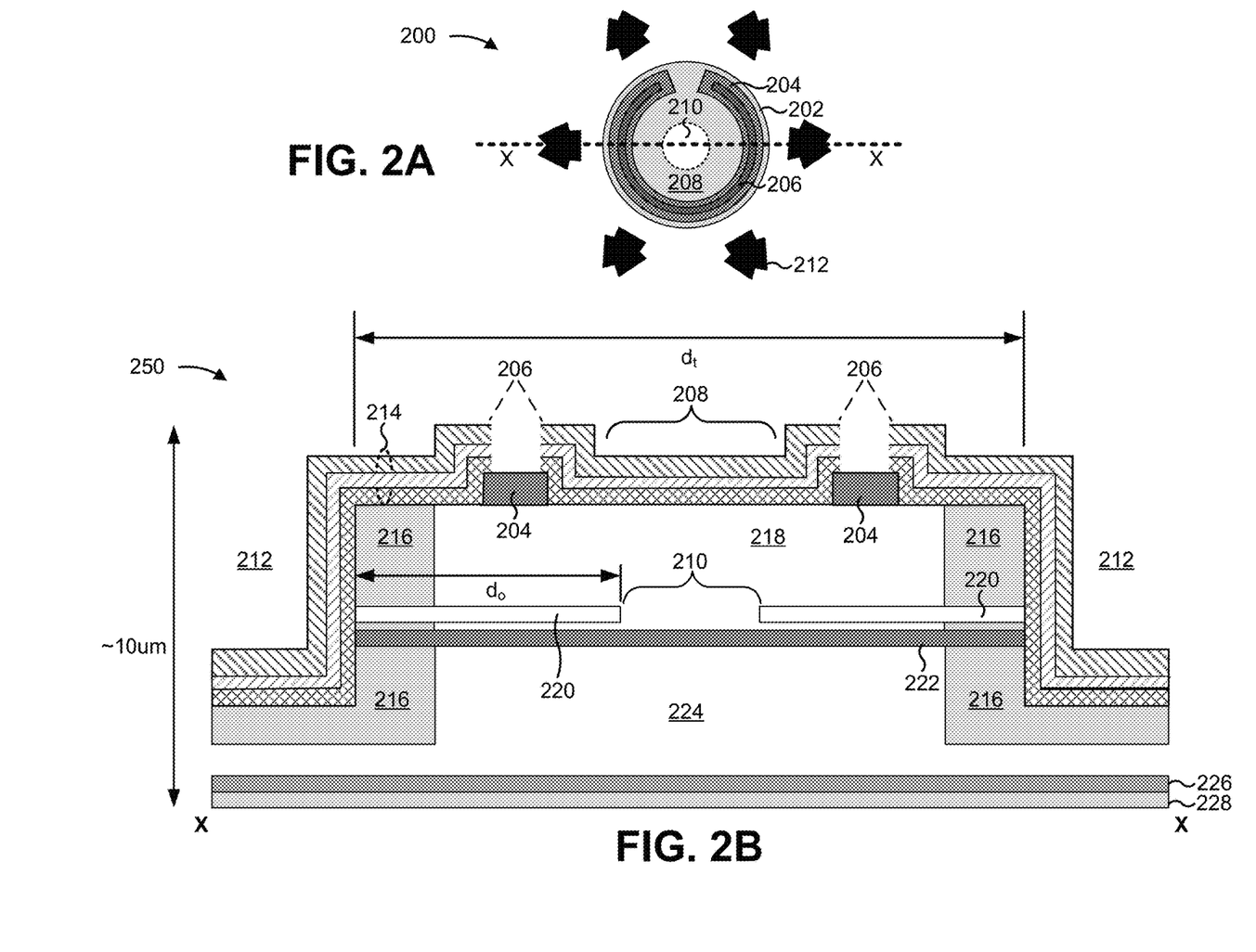
FIGS. 2A and 2B are diagrams depicting a top-view of an example emitter and an example cross-sectional view of the example emitter, respectively.

FIGS. 2A and 2B are diagrams depicting a top-view of an emitter 200 and an example cross-sectional view 250 of emitter 200, respectively. As shown in FIG. 2A, emitter 200 may include a set of emitter layers constructed in an emitter architecture. For purposes of clarity, not all emitter layers of emitter 200 are shown in FIG. 2A. In some implementations, emitter 200 may correspond to emitter 100 of FIG. 1A, emitter 105 of FIG. 1B, emitter 300 of FIG. 3A, emitter 302 of FIG. 3B, emitter 310 of FIG. 3C, emitter 312 of FIG. 3D, emitter 320 of FIG. 3E, emitter 322 of FIG. 3F, emitter 330 of FIG. 3G, emitter 332 of FIG. 3H, and/or the like.

As shown in FIG. 2A, emitter 200 includes an implant protection layer 202 that is circular in shape in this example. In some implementations, implant protection layer 202 may have another shape, such as an elliptical shape, a polygonal shape, or the like. Implant protection layer 202 is defined based on a space between sections of implant material included in emitter 200 (not shown). As further shown in FIG. 2A, emitter 200 includes a P-Ohmic metal layer 204 that is constructed in a partial ring-shape (e.g., with an inner radius and an outer radius). As shown, P-Ohmic metal layer 204 is positioned concentrically over implant protection layer 202 (i.e., the outer radius of P-Ohmic metal layer 204 is less than or equal to the radius of implant protection layer 202). Such configuration may be used, for example, in the case of a P-up/top-emitting emitter 200. In the case of a bottom-emitting emitter 200, the configuration may be adjusted as needed.

As further shown in FIG. 2A, emitter 200 includes a dielectric via opening 206 that is formed (e.g., etched) on a dielectric passivation/mirror layer that covers P-Ohmic metal layer 204 (not shown). As shown, dielectric via opening 206 is formed in a partial ring-shape (e.g., similar to P-Ohmic metal layer 204) and is formed concentrically over P-Ohmic metal layer 204 such that metallization of the dielectric passivation/mirror layer contacts P-Ohmic metal layer 204. In some implementations, dielectric opening 206 and/or P-Ohmic metal layer 204 may be formed in another shape, such as a full ring-shape or a split ring-shape.

As further shown, emitter 200 includes an optical aperture 208 in a portion of the emitter within the inner radius of the partial ring-shape of P-Ohmic metal layer 204. Emitter 200 emits a laser beam via optical aperture 208. As further shown, emitter 200 also includes a current confinement aperture 210 (e.g., an oxide aperture formed by an oxidation layer 220 of emitter 200). Current confinement aperture 210 is formed below optical aperture 208.

As further shown in FIG. 2A, emitter 200 includes a set of oxidation trenches 212 that are spaced (e.g., equally, unequally) around a circumference of implant protection layer 202. How close oxidation trenches 212 can be positioned relative to the optical aperture 208 is dependent on the application, and is typically limited by implant protection layer 202, P-Ohmic metal layer 204, dielectric via opening 206, and manufacturing tolerances.

The number and arrangement of layers shown in FIG. 2A are provided as an example. In practice, emitter 200 may include additional layers, fewer layers, different layers, or differently arranged layers than those shown in FIG. 2A. For example, while emitter 200 includes a set of six oxidation trenches 212, in practice, other designs are possible, such as a compact emitter that includes five oxidation trenches 212, seven oxidation trenches 212, and/or the like. As another example, while emitter 200 is a circular emitter design, in practice, other designs are possible, such as a rectangular emitter, a hexagonal emitter, an elliptical emitter, or the like. Additionally, or alternatively, a set of layers (e.g., one or more layers) of emitter 200 may perform one or more functions described as being performed by another set of layers of emitter 200, respectively.

Notably, while the design of emitter 200 is described as including a VCSEL, other implementations are possible. For example, the design of emitter 200 may apply in the context of another type of optical device, such as a light emitting diode (LED), or another type of vertical emitting (e.g., top emitting or bottom emitting) optical device. Additionally, the design of emitter 200 may apply to emitters of any wavelength, power level, emission profile, or the like. In other words, emitter 200 is not particular to an emitter with a given performance characteristic.

As shown in FIG. 2B, the example cross-sectional view may represent a cross-section of emitter 200 that passes through a pair of oxidation trenches 212 (e.g., as shown by the line labeled "X-X" in FIG. 2A). As shown, emitter 200 may include a backside cathode layer 228, a substrate layer 226, a bottom mirror 224, an active layer 222, an oxidation layer 220, a top mirror 218, an implant isolation material 216, a dielectric passivation/mirror layer 214, and a P-Ohmic metal layer 204. As shown, emitter 200 may have a total height that is approximately 10 µm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, and/or the like. In some implementations, substrate layer 226 may be a surface of a semiconductor wafer, and emitter 200 may be formed on the semiconductor wafer (e.g., to form an emitter wafer). In some implementations, substrate layer 226 may correspond to substrate layer 120, described above in connection with FIGS. 1A and 1B.

Bottom mirror 224 may include a bottom reflector layer of emitter 200. For example, bottom mirror 224 may include a distributed Bragg reflector (DBR). In some implementations, bottom mirror 224 may correspond to second mirror 135, described above in connection with FIGS. 1A and 1B.

Active layer 222 may include a layer that confines electrons and defines an emission wavelength of emitter 200. For example, active layer 222 may be a quantum well. In some implementations, active layer 222 may correspond to active layer 125, described above in connection with FIGS. 1A and 1B.

Oxidation layer 220 may include an oxide layer that provides optical and electrical confinement of emitter 200. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed. Oxidation layer(s) 220 may be proximate to active layer 222. In some implementations, oxidation layer 220 may correspond to oxidation layer 140, described above in connection with FIGS. 1A and 1B. As shown, oxidation layer 220 is farther from substrate layer 226 as compared to active layer 222 (e.g., substrate layer 226 is located on one side of active layer 222, and oxidation layer 220 is located on the opposite side of active layer 222).

As shown in FIG. 2B, when emitter 200 is a top-emitting laser, oxidation layer 220 is positioned between active layer 222 and optical aperture 208 from which emitter 200 emits a laser beam. In some implementations, when emitter 200 is a bottom-emitting laser, active layer 222 is positioned between oxidation layer 220 and optical aperture 208 from which emitter 200 emits a laser beam.

Current confinement aperture 210 may include an optically active aperture defined by oxidation layer 220. A size of current confinement aperture 210 may range, for example, from approximately 6.0 µm to approximately 14.0 µm. In some implementations, a size of current confinement aperture 210 may depend on a distance between oxidation trenches 212 that surround emitter 200. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as do in FIG. 2B) toward a center of emitter 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

Top mirror 218 may include a top reflector layer of emitter 200. For example, top mirror 218 may include a DBR. In some implementations, top mirror 218 may correspond to first mirror 130, described above in connection with FIGS. 1A and 1B.

Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202.

Dielectric passivation/mirror layer 214 may include a layer that acts as a protective passivation layer and that acts as an additional DBR. For example, dielectric passivation/mirror layer 214 may include one or more sub-layers (e.g., a $SiO_2$ layer, a $Si_3N_4$ layer) deposited (e.g., via chemical vapor deposition) on one or more other layers of emitter 200.

As shown, dielectric passivation/mirror layer 214 may include one or more dielectric via openings 206 that provide electrical access to P-Ohmic metal layer 204. Optical aperture 208 may include a portion of dielectric passivation/mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bondpad (not shown) that contacts P-Ohmic metal layer 204 through dielectric via openings 206).

In some implementations, emitter 200 may be manufactured using a series of steps. For example, bottom mirror 224, active layer 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation. Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 200 may include additional layers, fewer layers, different layers, differently constructed layers, or differently arranged layers than those shown in FIG. 2B. Additionally, or alternatively, a set layers (e.g., one or more layers) of emitter 200 may perform one or more functions described as being performed by another set of layers of emitter 200.

FIGS. 3A-3H are diagrams of example cross-sectional views of example emitters configured to control beam divergence and/or other optical mode characteristics. The emitters shown in FIGS. 3A-3H may include one or more elements described above in connection with FIGS. 1A, 1B, 2A, and/or 2B. For example, the emitters shown in FIGS. 3A-3H may include substrate layer 226, active layer 222, top mirror 218, bottom mirror 224, oxidation layer(s) 220, active region 145, oxidation area 150, and/or the like. Furthermore, while a single emitter is shown in each of FIGS. 3A-3H, techniques described herein may apply to an array of emitters. More particularly, techniques described herein may apply to an array of emitters that have both a common anode and a common cathode.

Figure 3A:
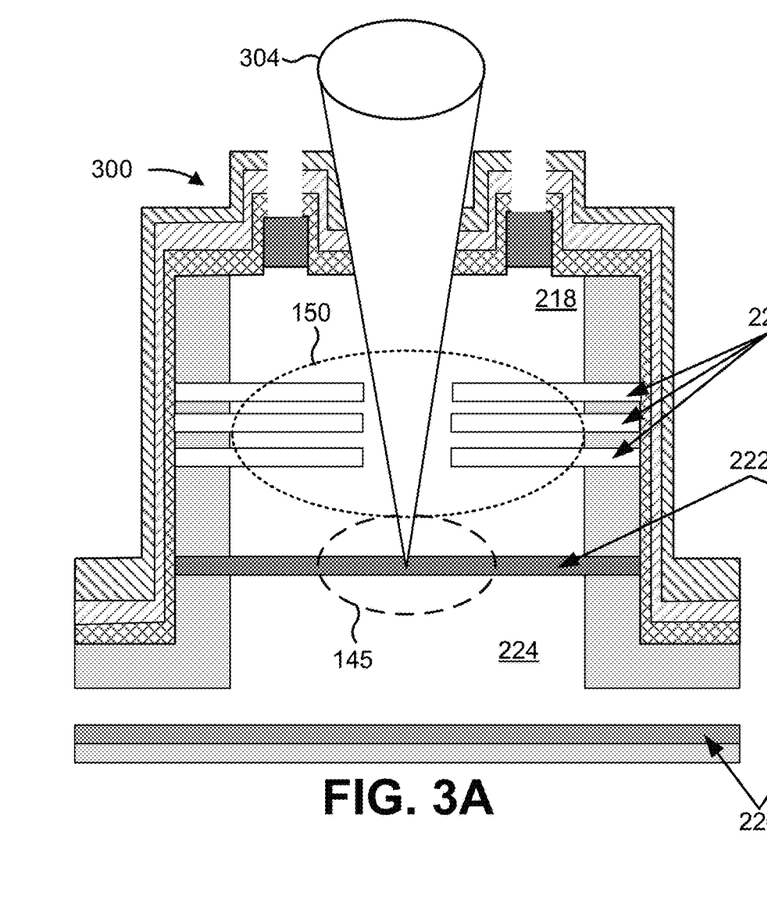
FIGS. 3A-3H are diagrams of example cross-sectional views of example emitters configured to control beam divergence.
Figure 3B:
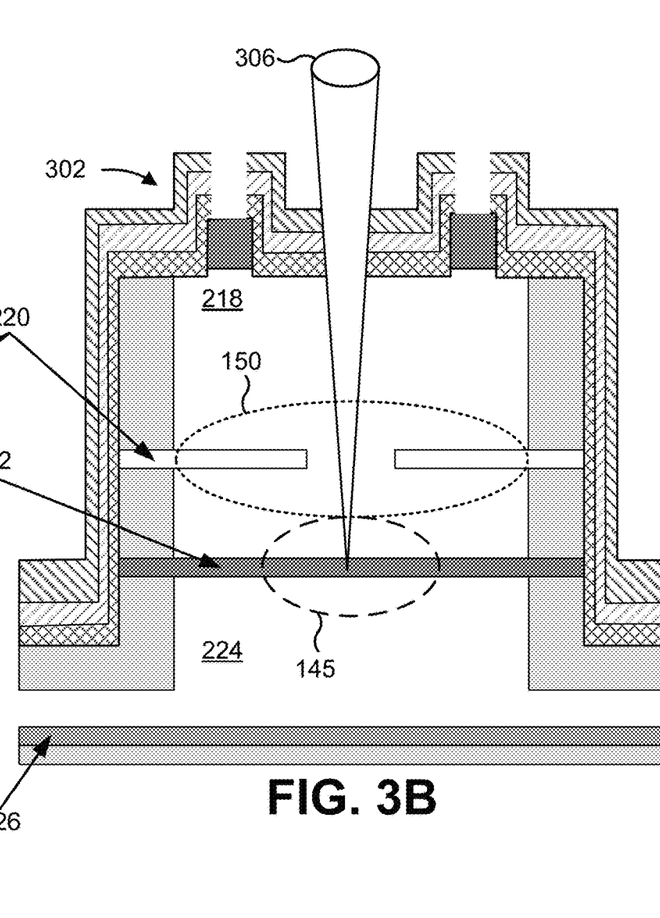

FIGS. 3A and 3B are diagrams of different emitters (e.g., VCSELs) 300, 302 with different beam divergences due to different quantities of oxidation layers 220. Emitter 300 may emit a laser beam 304 with a wider beam divergence, a higher numerical aperture, and a wider spectral width, while emitter 302 may emit a laser beam 306 with a narrower beam divergence, lower numerical aperture, and a narrower spectral width. As shown in FIGS. 3A and 3B, emitters 300, 302 may produce laser beams 304, 306 (respectively) with optical mode characteristics controlled by a quantity of oxidation layers 220 included in emitter 300, 302.

For example, emitter 300 includes a greater number of oxidation layers 220 (e.g., three oxidation layers 220), which increases an effective refractive index step between active region 145, of the active layer 222, and oxidation area 150 associated with the oxidation layers 220. Increasing the effective refractive index step proximate to active region 145 increases optical confinement and produces a laser beam with a wider divergence, a higher numerical aperture, and a wider spectral width, as shown by laser beam 304.

Conversely, emitter 302 includes a smaller number of oxidation layers 220 (e.g., one oxidation layer 220), which decreases an effective refractive index step between active region 145, of the active layer 222, and oxidation area 150 associated with the oxidation layers 220. Decreasing the effective refractive index step proximate to active region 145 decreases optical confinement and produces a laser beam with a narrower divergence, a lower numerical aperture, and a narrower spectral width, as shown by laser beam 306. The oxidation layer 220 closest to the active layer active region 145 may have the greatest impact on the effective refractive index step, and oxidation layers 220 may have a lesser impact on the effective refractive index step.

The quantity of oxidation layers 220 shown in FIGS. 3A and 3B are provided as examples, and different quantities of oxidation layers 220 may be included in an emitter (e.g., two oxidation layers 220, four oxidation layers 220, five oxidation layers 220, and/or the like). By modifying a quantity of oxidation layers 220 included in an emitter and/or by modifying one or more other oxidation layer characteristics (e.g., described elsewhere herein), emitters may be flexibly designed for a variety of applications that require different beam divergences, numerical apertures, and/or spectral widths.

Figure 3C:
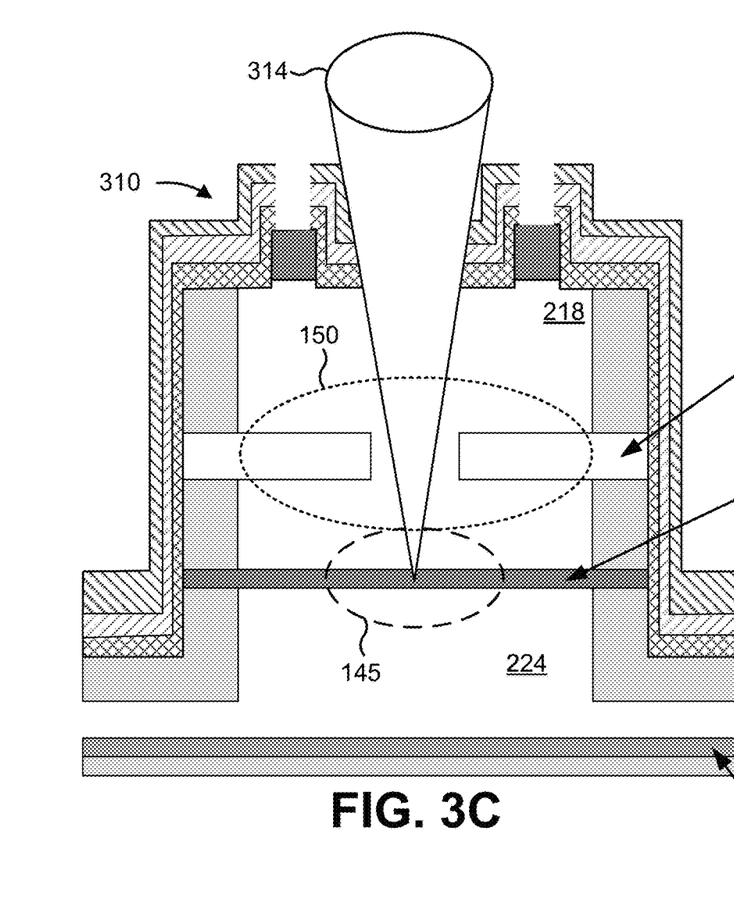
Figure 3D:
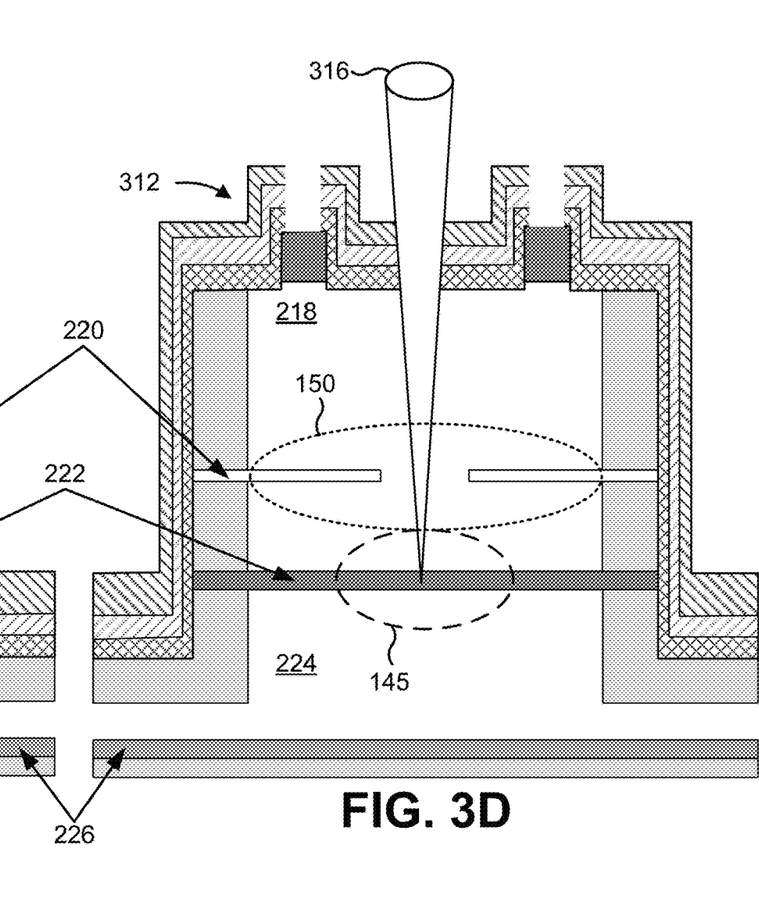

FIGS. 3C and 3D are diagrams of different emitters (e.g., VCSELs) 310, 312 with different beam divergences due to different thicknesses of one or more oxidation layers 220. Emitter 310 may emit a laser beam 314 with a wider beam divergence, a higher numerical aperture, and a wider spectral width, while emitter 312 may emit a laser beam 316 with a narrower beam divergence, lower numerical aperture, and a narrower spectral width. As shown in FIGS. 3C and 3D, emitters 310, 312 may produce laser beams 314, 316 (respectively) with optical mode characteristics controlled by a thickness of oxidation layer(s) 220 included in emitter 310, 312.

For example, emitter 310 includes a thicker oxidation layer 220 (e.g., 50-60 nanometers), which increases an effective refractive index step between active region 145, of the active layer 222, and oxidation area 150 associated with the oxidation layer 220. Increasing the effective refractive index step proximate to active region 145 increases optical confinement and produces a laser beam with a wider divergence, a higher numerical aperture, and a wider spectral width, as shown by laser beam 314.

Conversely, emitter 312 includes a thinner oxidation layer 220 (e.g., 10-20 nanometers), which decreases an effective refractive index step between active region 145, of the active layer 222, and oxidation area 150 associated with the oxidation layer 220. Decreasing the effective refractive index step proximate to active region 145 decreases optical confinement and produces a laser beam with a narrower divergence, a lower numerical aperture, and a narrower spectral width, as shown by laser beam 316.

The thicknesses of oxidation layers 220 shown in FIGS. 3C and 3D are provided as examples, and different thicknesses of oxidation layers 220 may be configured. Additionally, or alternatively, multiple oxidation layer characteristics may be configured to control optical mode characteristics (e.g., beam divergence, numerical aperture, spectral width, and/or the like). For example, different emitters may include different quantities of oxidation layers 220 and different thicknesses of one or more of the oxidation layers 220 to achieve a desired optical mode characteristic.

In some implementations, an emitter may include multiple oxidation layers 220 with different thicknesses (e.g., a thicker oxidation layer 220 closer to active layer 222 and a thinner oxidation layer 220 farther from active layer 222, or a thinner oxidation layer 220 closer to active layer 222 and a thicker oxidation layer 220 farther from active layer 222). By modifying a thickness of oxidation layer(s) 220 included in an emitter and/or by modifying one or more other oxidation layer characteristics (e.g., described elsewhere herein), emitters may be flexibly designed for a variety of applications that require different beam divergences, numerical apertures, and/or spectral widths.

Figure 3E:
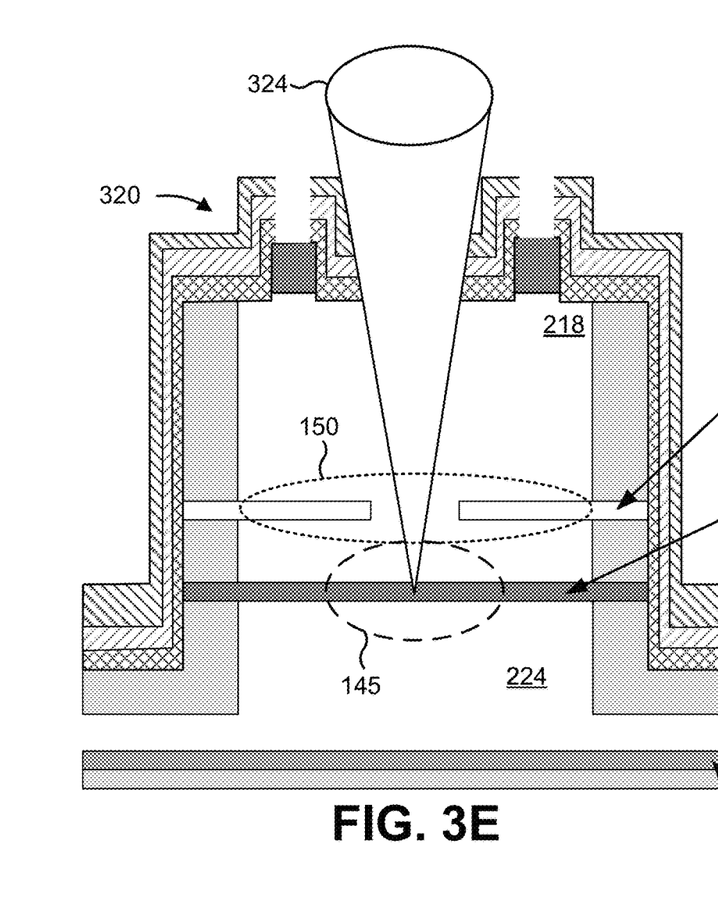
Figure 3F:
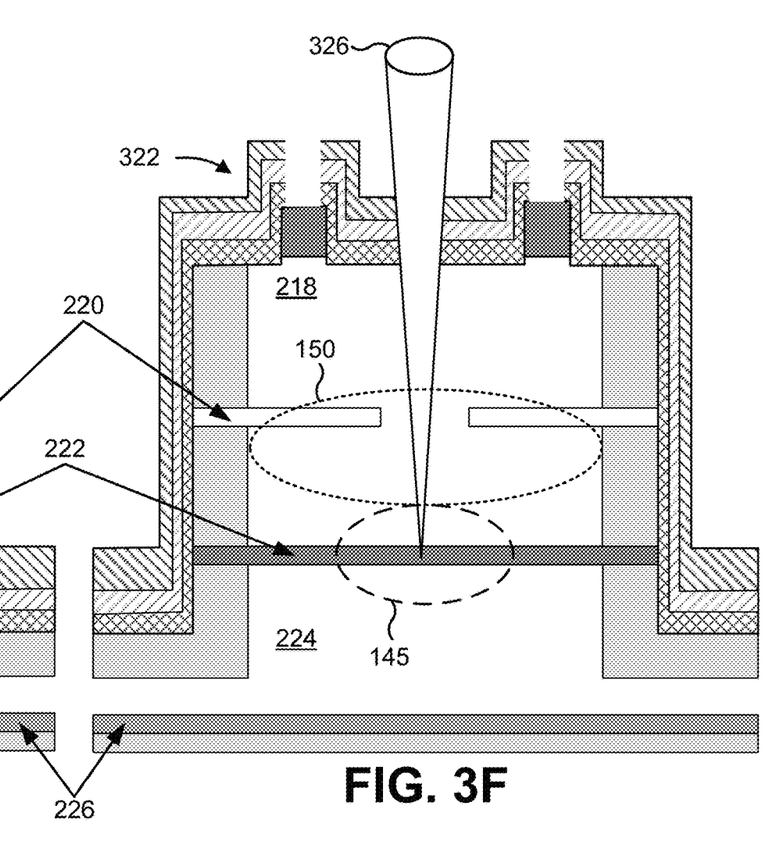

FIGS. 3E and 3F are diagrams of different emitters (e.g., VCSELs) 320, 322 with different beam divergences due to different proximities of one or more oxidation layers 220 to active layer 222. Emitter 320 may emit a laser beam 324 with a wider beam divergence, a higher numerical aperture, and a wider spectral width, while emitter 322 may emit a laser beam 326 with a narrower beam divergence, a lower numerical aperture, and a narrower spectral width. As shown in FIGS. 3E and 3F, emitters 320, 322 may produce laser beams 324, 326 (respectively) with optical mode characteristics controlled by a proximity of one or more oxidation layers 220, included in emitter 320, 322, to an active layer 222 included in emitter 320, 322.

For example, emitter 320 includes an oxidation layer 220 positioned closer to active layer 222, which increases an effective refractive index step between active region 145, of the active layer 222, and oxidation area 150 associated with the oxidation layer 220. Increasing the effective refractive index step proximate to active region 145 increases optical confinement and produces a laser beam with a wider divergence, a higher numerical aperture, and a wider spectral width, as shown by laser beam 324.

Conversely, emitter 322 includes an oxidation layer 220 positioned farther from active layer 222, which decreases an effective refractive index step between active region 145, of the active layer 222, and oxidation area 150 associated with the oxidation layer 220. Decreasing the effective refractive index step proximate to active region 145 decreases optical confinement and produces a laser beam with a narrower divergence, a lower numerical aperture, and a narrower spectral width, as shown by laser beam 326.

The proximities of oxidation layers 220 to active layers 222 shown in FIGS. 3E and 3F are provided as examples, and different proximities may be configured. Additionally, or alternatively, multiple oxidation layer characteristics may be configured to control optical mode characteristics (e.g., beam divergence, numerical aperture, spectral width, and/or the like). For example, different emitters may include different quantities of oxidation layers 220, different thicknesses of one or more of the oxidation layers 220, and/or different proximities of one or more oxidation layers 220 to active layer 222 to achieve a desired optical mode characteristic.

In some implementations, an emitter may include multiple oxidation layers 220 with different proximities to active layer 222. In this case, a proximity of a single oxidation layer 220 to the active layer 222 (e.g., an oxidation layer 220 closest to the active layer 222) may be configured to modify optical mode characteristics. Additionally, or alternatively, proximities of multiple oxidation layers 220 to the active layer 222 may be configured to modify optical mode characteristics. By modifying corresponding proximities of oxidation layer(s) 220 included in an emitter and/or by modifying one or more other oxidation layer characteristics (e.g., described elsewhere herein), emitters may be flexibly designed for a variety of applications that require different beam divergences, numerical apertures, and/or spectral widths.

Figure 3G:
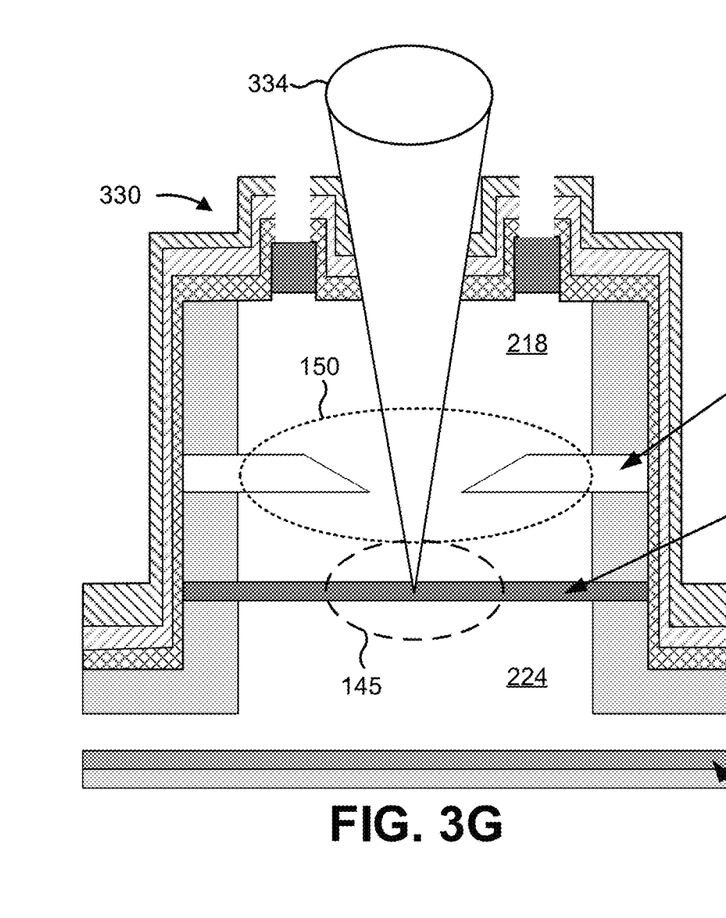
Figure 3H:
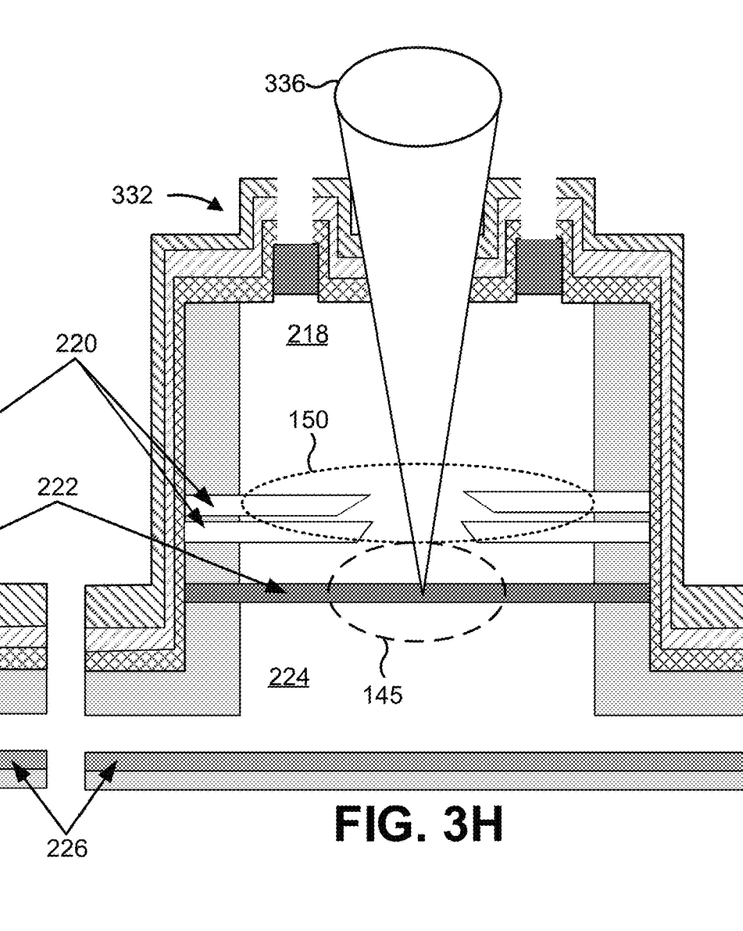

FIGS. 3G and 3H are diagrams of different emitters (e.g., VCSELs) 330, 332 with different shapes of one or more oxidation layers 220. Emitters 330, 332 may emit laser beams 334, 336 (respectively) with a wider beam divergence, a higher numerical aperture, and a wider spectral width. As shown in FIGS. 3G and 3H, emitters 330, 332 may produce laser beams 334, 336 (respectively) with optical mode characteristics controlled by a shape of one or more oxidation layers 220 included in emitter 330, 332.

For example, emitter 330 includes an oxidation layer 220 with a tapered end (e.g., a tapered central end located closer to the center of mirror 218). Tapering an end of oxidation layer 220 decreases an effective refractive index step between active region 145, of the active layer 222, and oxidation area 150 associated with the oxidation layer 220 (e.g., as compared to an end that is not tapered). However, such tapering may increase mechanical reliability of emitter 330 to offset a decrease in mechanical reliability due to a configuration of another optical mode characteristic (e.g., a thicker oxidation layer 220, an increased number of oxidation layers 220, an oxidation layer 220 positioned closer to active layer 222, and/or the like).

For example, as shown in FIG. 3G, emitter 330 includes a thick oxidation layer 220, which increases an effective refractive index step between active region 145, of the active layer 222, and oxidation area 150 associated with the oxidation layer 220. Increasing the effective refractive index step proximate to active region 145 increases optical confinement and produces a laser beam with a wider divergence, a higher numerical aperture, and a wider spectral width, as shown by laser beam 334. Furthermore, because oxidation layer 220 includes tapered ends, emitter 330 may exhibit improved mechanical stability and reliability as compared to a similar emitter with a similar thickness of an oxidation layer 220 that is not tapered (e.g., such as emitter 310 of FIG. 3C).

Similarly, as shown in FIG. 3H, emitter 332 includes an oxidation layer 220 positioned closer to active layer 222, which increases an effective refractive index step between active region 145, of the active layer 222, and oxidation area 150 associated with the oxidation layer 220. Increasing the effective refractive index step proximate to active region 145 increases optical confinement and produces a laser beam with a wider divergence, a higher numerical aperture, and a wider spectral width, as shown by laser beam 336. Furthermore, because oxidation layer 220 includes tapered ends, emitter 332 may exhibit improved mechanical stability and reliability as compared to a similar emitter with a similar proximity between active layer 222 and an oxidation layer 220 that is not tapered (e.g., such as emitter 320 of FIG. 3E). However, in some implementations, one or more oxidation layers 220 may not be tapered (or may have less than a threshold degree of tapering) to improve ease of design of the VCSEL. In some implementations, an oxidation layer 220, closest to the active layer 222, is not tapered or has less than a threshold degree of tapering.

As shown in FIG. 3G, the oxidation layer 220 of emitter 330 is shown with a deeper depth of oxidation on a first portion of oxidation layer 220 positioned closer to active layer 222, and a shallower depth of oxidation on a second portion of oxidation layer 220 positioned farther from active layer 222. As shown in FIG. 3H, the oxidation layer 220 of emitter 332 is shown with a shallower depth of oxidation on a first portion of oxidation layer 220 positioned closer to active layer 222, and a deeper depth of oxidation on a second portion of oxidation layer 220 positioned farther from active layer 222. These shapes of oxidation layers are provided as examples, and other examples are possible. For example, a first portion of oxidation layer 220 positioned closer to active layer 222 may have a relatively shallow depth of oxidation, a second portion of oxidation layer 220 positioned farther from active layer 222 may have a relatively shallow depth of oxidation, and a third portion of oxidation layer 220 positioned between the first portion and the second portion may have a relatively deep depth of oxidation.

Additionally, or alternatively, multiple oxidation layer characteristics may be configured to control optical mode characteristics (e.g., beam divergence, numerical aperture, spectral width, and/or the like). For example, different emitters may include different quantities of oxidation layers 220, different thicknesses of one or more of the oxidation layers 220, different proximities of one or more oxidation layers 220 to active layer 222, and/or different shapes of oxidation layers 220 to achieve a desired optical mode characteristic.

In some implementations, an emitter may include multiple oxidation layers 220 with different shapes. In this case, a shape of a single oxidation layer 220 (e.g., an oxidation layer 220 closest to the active layer 222) may be configured to modify optical mode characteristics. Additionally, or alternatively, shapes of multiple oxidation layers 220 to the active layer 222 may be configured to modify optical mode characteristics. By modifying corresponding shapes of oxidation layer(s) 220 included in an emitter and/or by modifying one or more other oxidation layer characteristics (e.g., described elsewhere herein), emitters may be flexibly designed for a variety of applications that require different beam divergences, numerical apertures, and/or spectral widths.

As indicated above, FIGS. 3A-3H are provided as examples. Other examples are possible and may differ from what was described in connection with FIGS. 3A-3H.

Figure 4:
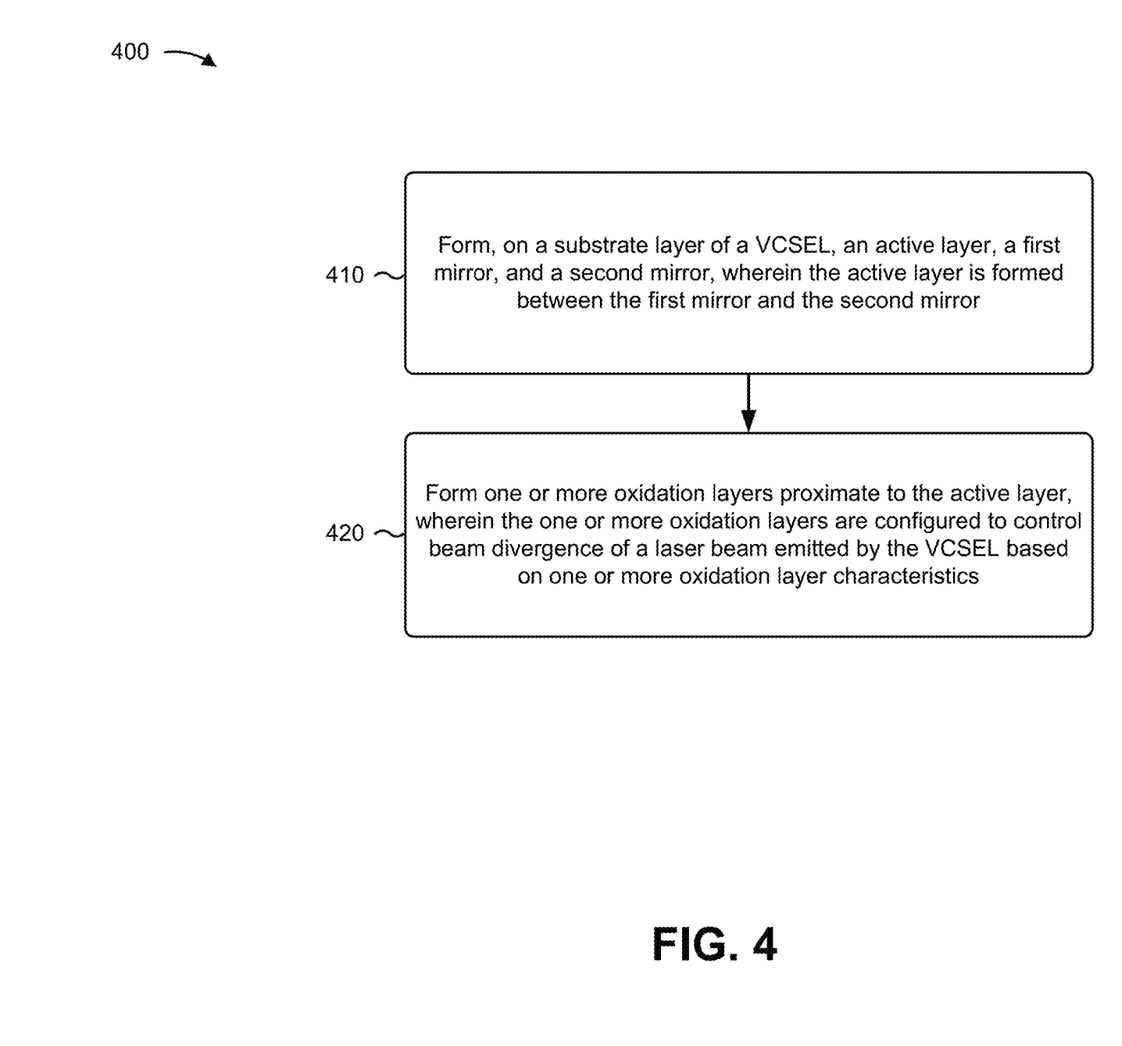
FIG. 4 is a flow chart of an example process for controlling beam divergence in a VCSEL.

FIG. 4 is a flow chart of an example process 400 for controlling beam divergence in a VCSEL.

As shown in FIG. 4, process 400 may include forming, on a substrate layer of a VCSEL, an active layer, a first mirror, and a second mirror, wherein the active layer is formed between the first mirror and the second mirror (block 410). In some implementations, the VCSEL is a top emitting VCSEL. In some implementations, the VCSEL is a bottom emitting VCSEL.

As further shown in FIG. 4, process 400 may include forming one or more oxidation layers proximate to the active layer, wherein the one or more oxidation layers are configured to control beam divergence of a laser beam emitted by the VCSEL based on one or more oxidation layer characteristics (block 420). In some implementations, the one or more oxidation layers are configured to create a relatively large effective refractive index step, proximate to an active region of the active layer, to form a relatively wide beam divergence of the laser beam. In some implementations, the one or more oxidation layers are configured to create a relatively small effective refractive index step, proximate to an active region of the active layer, to form a relatively narrow beam divergence of the laser beam.

In some implementations, the beam divergence is controlled based on at least one of: a quantity of the one or more oxidation layers, one or more shapes of the one or more oxidation layers, one or more thicknesses of the one or more oxidation layers, or one or more proximities of the one or more oxidation layers to the active layer. For example, the one or more oxidation layers may include multiple oxidation layers to control the beam divergence. Additionally, or alternatively, a shape of the one or more oxidation layers may be configured to control the beam divergence. Additionally, or alternatively, a thickness of the one or more oxidation layers may be configured to control the beam divergence. Additionally, or alternatively, a proximity of the one or more oxidation layers to the active layer may be configured to control the beam divergence.

In some implementations, an oxidation layer, of the one or more oxidation layers, closest to the active layer has less than a threshold degree of tapering. For example, an oxidation layer, of the one or more oxidation layers, closest to the active layer may not be tapered.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Some techniques described herein permit the flexible design of emitters (e.g., VCSELs) for a variety of applications that require different optical mode characteristics, such as beam divergences, numerical apertures, and/or spectral widths.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A vertical cavity surface emitting laser (VCSEL), comprising:
   a substrate layer; and
   epitaxial layers on the substrate layer,
      the epitaxial layers including an active layer, a first mirror, a second mirror, and an oxidation layer,
         wherein the active layer is between the first mirror and the second mirror,
         wherein the oxidation layer includes a first oxidation layer and a second oxidation layer,
         wherein the second oxidation layer is a closest oxidation layer to the active layer and the substrate layer,
         wherein the first oxidation layer includes a first tapered end that is tapered from a farthest side from the substrate layer to a closest side to the substrate layer,
         wherein a taper length of the first tapered end is between 0.5 and 2 micrometers,
         wherein the first oxidation layer has a first aperture size at the farthest side from the substrate layer and a second aperture size at the closest side to the substrate layer,
            the first aperture size being less than the second aperture size,
         wherein the second oxidation layer is located between the first oxidation layer and the active layer,
         wherein the first tapered end of the first oxidation layer has greater than or equal to a threshold degree of tapering and a second end of the second oxidation layer has less than the threshold degree of tapering, and
         wherein the oxidation layer is configured to control beam divergence of a laser beam emitted by the VCSEL based on:
            a proximity of the oxidation layer to the active layer.

2. The VCSEL of claim 1, wherein the first oxidation layer is configured to create an effective refractive index step, between an active region of the active layer and an oxidation area associated with the first oxidation layer, to form a wide beam divergence of the laser beam when compared to a beam divergence created by a differently configured oxidation layer.

3. The VCSEL of claim 1, wherein the oxidation layer includes a third oxidation layer to control the beam divergence.

4. The VCSEL of claim 1, wherein a shape of at least one of the first oxidation layer or the second oxidation layer is configured to further control the beam divergence.

5. The VCSEL of claim 1, wherein a thickness of at least one of the first oxidation layer or the second oxidation layer is configured to further control the beam divergence.

6. The VCSEL of claim 1, wherein the proximity of the oxidation layer to the active layer is configured to control the beam divergence.

7. The VCSEL of claim 1, wherein the VCSEL is a top emitting VCSEL.

8. The VCSEL of claim 1, wherein the VCSEL is a bottom emitting VCSEL.

9. The VCSEL of claim 1, wherein the second end of the second oxidation layer is not tapered.

10. A method of controlling beam divergence in a vertical cavity surface emitting laser (VCSEL), comprising:
 forming, on a substrate layer of the VCSEL, an active layer, a first mirror, and a second mirror,
  wherein the active layer is formed between the first mirror and the second mirror; and
 forming an oxidation layer that includes a first oxidation layer and a second oxidation layer,
  wherein the second oxidation layer is a closest oxidation layer to the active layer and the substrate layer,
  wherein the first oxidation layer includes a first tapered end that is tapered from a farthest side from the substrate layer to a closest side to the substrate layer,
  wherein a taper length of the first tapered end is between 0.5 and 2 micrometers,
  wherein the first oxidation layer has a first aperture size at the farthest side from the substrate layer and a second aperture size at the closest side to from the substrate layer,
   the first aperture size being less than the second aperture size,
  wherein the second oxidation layer is located between the first oxidation layer and the active layer,
  wherein the first tapered end of the first oxidation layer has greater than or equal to a threshold degree of tapering and a tapered end of the second oxidation layer has less than the threshold degree of tapering, and
  wherein the oxidation layer is configured to control beam divergence of a laser beam emitted by the VCSEL based on:
   a proximity of the oxidation layer to the active layer.

11. The method of claim 10, wherein the first oxidation layer is configured to create a relatively large effective refractive index step, proximate to an active region of the active layer, to form a relatively wide beam divergence of the laser beam when compared to a beam divergence created by a differently configured oxidation layer.

12. The method of claim 10, wherein the first oxidation layer is configured to create a relatively small effective refractive index step, proximate to an active region of the active layer, to form a relatively narrow beam divergence of the laser beam when compared to a beam divergence created by a differently configured oxidation layer.

13. The method of claim 10, wherein the VCSEL is a top emitting VCSEL.

14. A vertical cavity surface emitting laser (VCSEL) wafer, comprising:
 a substrate layer; and
 epitaxial layers on the substrate layer,
  wherein the epitaxial layers include:
   an active layer between a first mirror and a second mirror,
   a first oxidation layer configured to control beam divergence of an emitted laser beam by controlling an effective refractive index step proximate to an active region of the active layer based on:
    a proximity of the first oxidation layer to the active region of the active layer,
   wherein the first oxidation layer includes a first tapered end that is tapered from a farthest side from the substrate layer to a closest side to the substrate layer,
   wherein a taper length of the first tapered end is between 0.5 and 2 micrometers,
   wherein the first oxidation layer has a first aperture size at the farthest side from the substrate layer and a second aperture size at the closest side to from the substrate layer,
    the first aperture size being less than the second aperture size and,
   a second oxidation layer located between the first oxidation layer and the active layer,
    wherein the second oxidation layer is a closest oxidation layer to the active layer and the substrate layer, and
    wherein the first tapered end of the first oxidation layer has greater than or equal to a threshold degree of tapering and a tapered end of the second oxidation layer has less than the threshold degree of tapering.

15. The VCSEL wafer of claim 14, wherein the epitaxial layers further include:
 a third oxidation layer to control the beam divergence.

16. The VCSEL wafer of claim 14, wherein the VCSEL is a top emitting VCSEL or a bottom emitting VCSEL.

17. The VCSEL wafer of claim 14, wherein the beam divergence is further controlled based on a shape of the first oxidation layer.

18. The VCSEL wafer of claim 14, wherein the beam divergence is further controlled based on a thickness of the first oxidation layer.

19. The VCSEL wafer of claim 14, wherein the beam divergence is controlled based on the proximity of the first oxidation layer to the active region of the active layer.

20. The VCSEL wafer of claim 14, wherein the first oxidation layer is configured to create an effective refractive index step, between the active region of the active layer and an oxidation area associated with the first oxidation layer, to form a wide beam divergence of the emitted laser beam when compared to a beam divergence created by a differently configured oxidation layer.

\* \* \* \* \*